(12) United States Patent
Lanzillo et al.

(10) Patent No.: US 12,740,394 B2
(45) Date of Patent: Sep. 15, 2026

(54) SUBTRACTIVE LINES AND VIAS WITH WRAP-AROUND CONTACT

(71) Applicant: INTERNATIONAL BUSINESS MACHINES CORPORATION, Armonk, NY (US)

(72) Inventors: Nicholas Anthony Lanzillo, Wynantskill, NY (US); Lawrence A. Clevenger, Saratoga Springs, NY (US); Brent A. Anderson, Jericho, VT (US); Albert M. Chu, Nashua, NH (US); Reinaldo Vega, Mahopac, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 835 days.

(21) Appl. No.: 17/934,195

(22) Filed: Sep. 21, 2022

(65) Prior Publication Data

US 2024/0096786 A1 Mar. 21, 2024

(51) Int. Cl.

| | |
|---|---|
| ***H10W 20/42*** | (2026.01) |
| ***H10W 20/00*** | (2026.01) |
| ***H10W 20/41*** | (2026.01) |

(52) U.S. Cl.
CPC ......... *H10W 20/42* (2026.01); *H10W 20/056* (2026.01); *H10W 20/082* (2026.01); *H10W 20/085* (2026.01); *H10W 20/435* (2026.01)

(58) Field of Classification Search
CPC ........... H01L 23/5226; H01L 21/76804; H01L 21/76834; H01L 21/76885; H10W 20/42; H10W 20/056; H10W 20/082; H10W 20/085; H10W 20/435
See application file for complete search history.

(56) References Cited

U.S. PATENT DOCUMENTS

| | | | | |
|---|---|---|---|---|
| 5,610,101 | A | 3/1997 | Koyama | |
| 7,459,381 | B2 | 12/2008 | Sutardja | |
| 8,987,909 | B2 | 3/2015 | Nansei | |
| 10,256,186 | B2 | 4/2019 | Bonilla et al. | |
| 10,354,912 | B2 | 7/2019 | Xu et al. | |
| 10,818,597 | B2 | 10/2020 | Liu et al. | |
| 11,158,537 | B2 | 10/2021 | Anderson et al. | |
| 11,217,530 | B2 | 1/2022 | Kudo et al. | |
| 11,348,832 | B2 | 5/2022 | Backes et al. | |
| 2018/0076133 | A1* | 3/2018 | Bonilla | H01L 21/76877 |
| 2020/0066630 | A1* | 2/2020 | Bao | H01L 21/02126 |
| 2021/0296171 | A1 | 9/2021 | Anderson et al. | |

* cited by examiner

*Primary Examiner* — Zandra V Smith
*Assistant Examiner* — Corbyn D Mellinger
(74) *Attorney, Agent, or Firm* — Samuel A. Waldbaum

(57) ABSTRACT

An interconnect structure for connecting an upper wiring line to a lower wiring line includes a via connecting a lower portion of the upper wiring line with an upper surface of the lower wiring line and a wrap-around via portion formed integrally with the via, the wrap-around portion extending along and electrically contacting a portion of the sides of the lower wiring line.

14 Claims, 9 Drawing Sheets

600
602
604
606
608
610
524
528
208
204
206
612
530
614
202
212
210

SUBTRACTIVE LINES AND VIAS WITH WRAP-AROUND CONTACT

BACKGROUND

Technical Field

The present disclosure generally relates to integrated circuits (ICs), and more particularly, to interconnect structures for integrated circuits.

Description of the Related Art

ICs (also referred to as a chip or a microchip) include electronic circuits on a wafer. The wafer is a semiconductor material, such as, for example, silicon or other materials. An IC includes a large number of individual devices formed on the wafer. The individual devices, such as transistors, capacitors, resistors, and the like, are typically formed in earlier layers of the IC known as front-end-of-line (FEOL) layers.

The back-end-of-line (BEOL) is the stage of IC fabrication where conductive wiring interconnect networks are established to form interconnect structures that interconnect FEOL devices with one another. Typically, the wiring interconnect networks include two types of interconnect elements (often referred to as interconnects) that serve as electrical conductors, namely, conductive lines, such as subtractive lines, that traverse a distance across the chip, and conductive vias that connect the conductive lines at different levels (typically referred to as metallization layers). The conductive lines and conductive vias are typically made of conductive material, such as aluminum or copper, and are electrically insulated by interlayer dielectrics (ILD).

Presently, there are no interconnect structures that attempt to minimize resistance between the metallization layers and the subtractive lines of an IC.

SUMMARY

In one embodiment, an interconnect structure for connecting an upper wiring line to a lower wiring line includes a via connecting a lower portion of the upper wiring line with an upper surface of the lower wiring line and a wrap-around via portion formed integrally with the via, the wrap-around portion extending along and electrically contacting a portion of the sides of the lower wiring line.

In one embodiment, an interconnect structure for connecting an upper wiring line to a lower wiring line includes a damascene via connecting a lower portion of the upper wiring line with an upper surface of the lower wiring line and an upper surface of an adhesive layer on sides of the lower wiring line and a wrap-around via portion formed integrally with the damascene via, the wrap-around portion extending along and electrically contacting a portion of the sides of the lower wiring line, the wrap-around portion replacing a portion of the adhesive layer.

In one embodiments, a method for making an interconnect between a lower wiring line and an upper wiring line includes forming the lower wiring line as a subtractive line. An adhesive layer is then formed on sidewalls of the subtractive line. A dielectric layer is deposited around the adhesive layer and above the subtractive line. An opening is etched in the dielectric layer to provide a location for the upper wiring line. A damascene via is etched in the dielectric layer down to a top surface of the subtractive line and down to a top surface of the adhesive layer. A portion of the adhesive layer is etched to form a wrap-around portion extending from the damascene via. A metal is deposited for the upper line, the damascene via, and the wrap-around portion.

By virtue of the concepts discussed herein, an interconnect structure and method for making the same are provided that enables low-resistance wrap-around via connections where ground rules will allow, while also enabling tighter-pitch subtractive vias where appropriate. The design flexibility of the interconnect structures according to the present disclosure allows via-bar shapes to be drawn without landing on a wide line below.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

Figure 1:
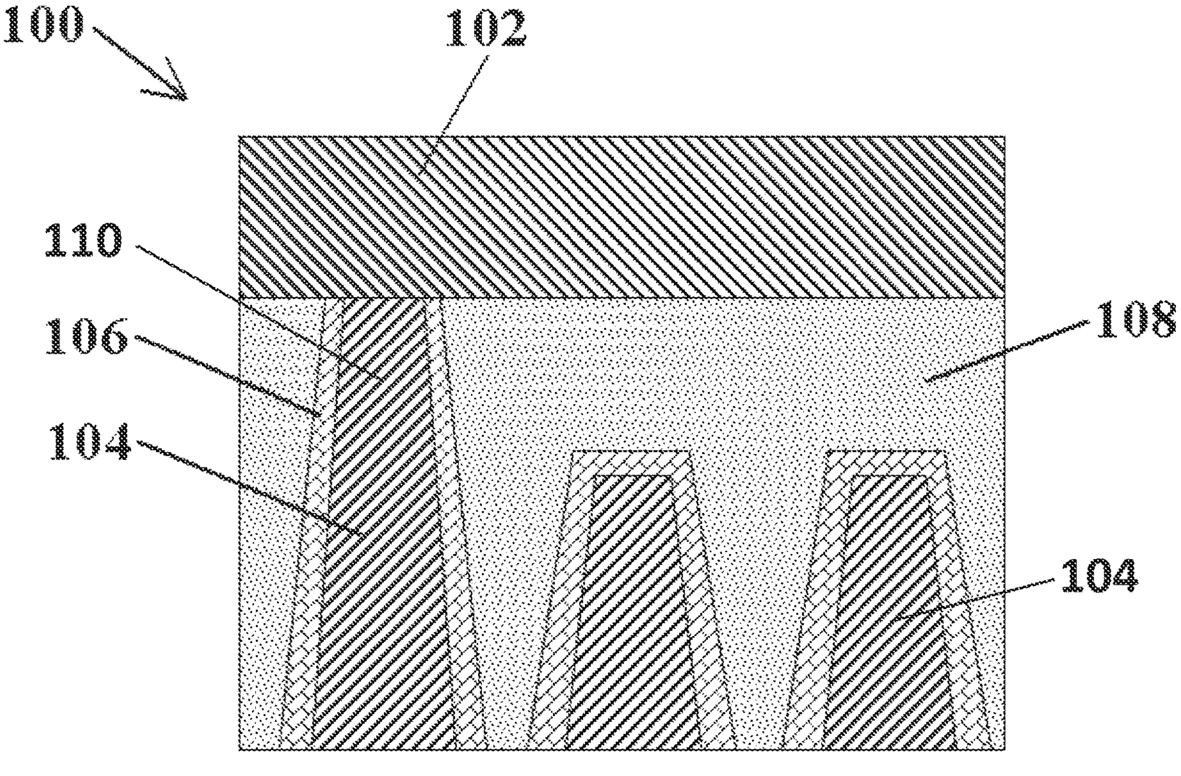
FIG. 1 is a representation of a conventional interconnect structure connecting a first metal line with an upper deposited metal layer.

Referring to FIG. 1, a conventional interconnect structure 100 can include one or more first interconnect wiring lines 104 and a second interconnect wiring line 102. The first interconnect wiring lines 104 (three of which are shown in FIG. 1) run into and out of the plane of the page while the second interconnect wiring line 102 runs left to right, typically orthogonal to the direction of the first one or more first interconnect wiring lines 104. A subtractive via 110 can be used to extend one of the first interconnect wiring lines 104 connect at least one of the first interconnect wiring lines 104 with the second interconnect wiring line 102. Each of the first interconnect wiring lines 104 can include an adhesive layer 106, such as silicon nitride, silicon carbide, silicon carbon nitride, or the like. A dielectric layer 108, such as an ultra low K (ULK) dielectric layer may separate the first and second wiring lines 104, 102 where a via is not present and electrical contact is not desired.

As can be seen in FIG. 1, contact between the first and second wiring lines 104, 102 are limited to the top surface of the subtractive via 110 and a portion of the bottom surface of the second siring line 102.

Figure 2:
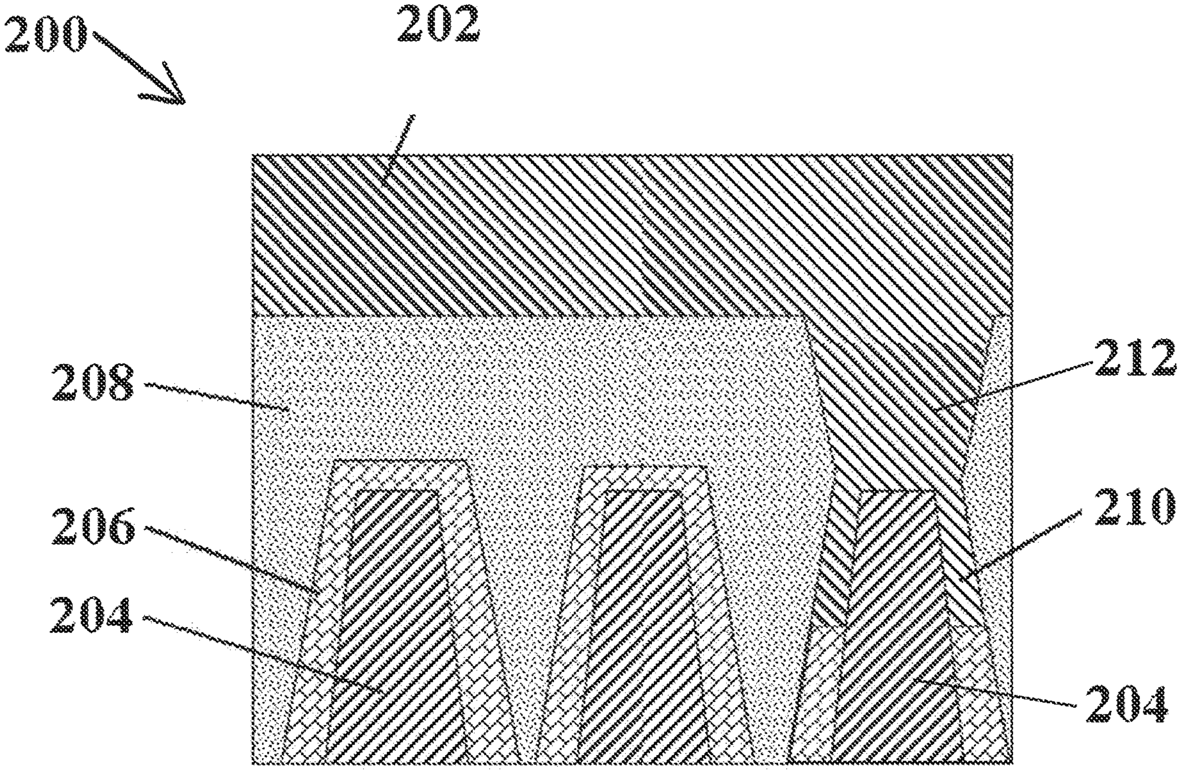
FIG. 2 is a cross-sectional representation of a wrap-around interconnect structure according to an illustrative embodiment.

Referring now to FIG. 2, to increase the contact area between one of the first wiring lines 204 and a second wiring line 202, a damascene via 212 can be formed through the dielectric layer 208 to both contact the top of first wiring line 204 and further extend along each side of the first wiring line 204 to form a wrap-around portion 210 by the removal of a portion of the adhesive layer 206, as described in greater detail below. Typically, the wrap-around portion 210 will extend downward along the side of the first wiring line 204 at least 5% of the height of the first wiring line 204, typically at least 10% or more of the height of the first wiring line 204 and often at least 20% of the height of the first wiring line 204. The resulting interconnect structure 200, including the damascene via 212 and the wrap-around portion 210, can provide an interconnect structure that provides less resistance as compared to conventional interconnect structures, such as that shown in FIG. 1.

Figure 3:
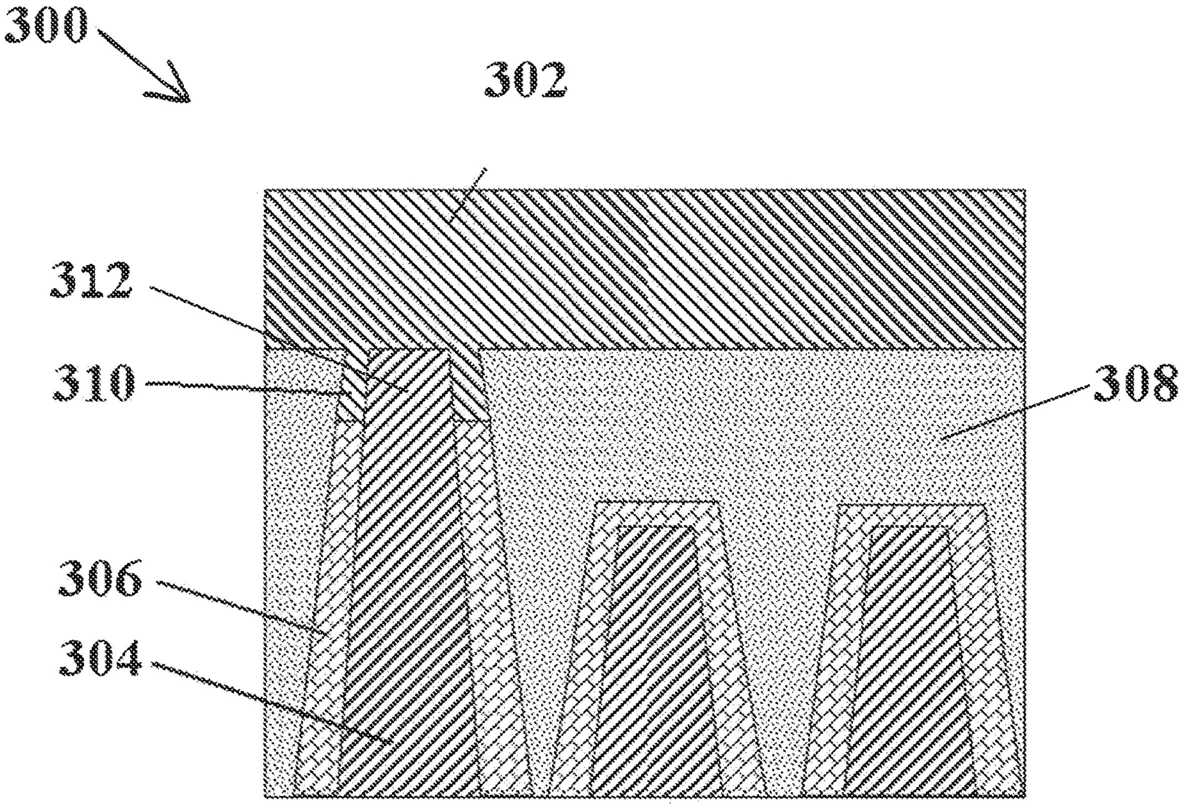
FIG. 3 is a cross-sectional representation of a wrap-around interconnect structure according to an illustrative embodiment.

Referring to FIG. 3, to increase the contact area between one of the first wiring lines 304 and a second wiring line 302, a subtractive via 312 can extend the height of one of the first wiring lines 304 to contact the top of first wiring line 304, similar to the conventional interconnect structure of FIG. 1. Further, a portion of the adhesive layer 306 may be removed from the subtractive via 310, as described in greater detail below, to permit the second wiring line 302 to extend along each side of the subtractive via 312 to form a wrap-around portion 310. Typically, the wrap-around portion 310 will extend downward along the side of the subtractive via 312 at least 5% of the height of the subtractive via 312, typically at least 10% or more of the height of the subtractive via 312 and often at least 20% of the height of the subtractive via 312. The resulting interconnect structure 300, including the wrap-around portion 310, can provide an interconnect structure that provides less resistance as compared to conventional interconnect structures, such as that shown in FIG. 1. Like the above embodiments, a dielectric layer 308 may separate the first and second wiring lines 304, 302.

Figure 4:
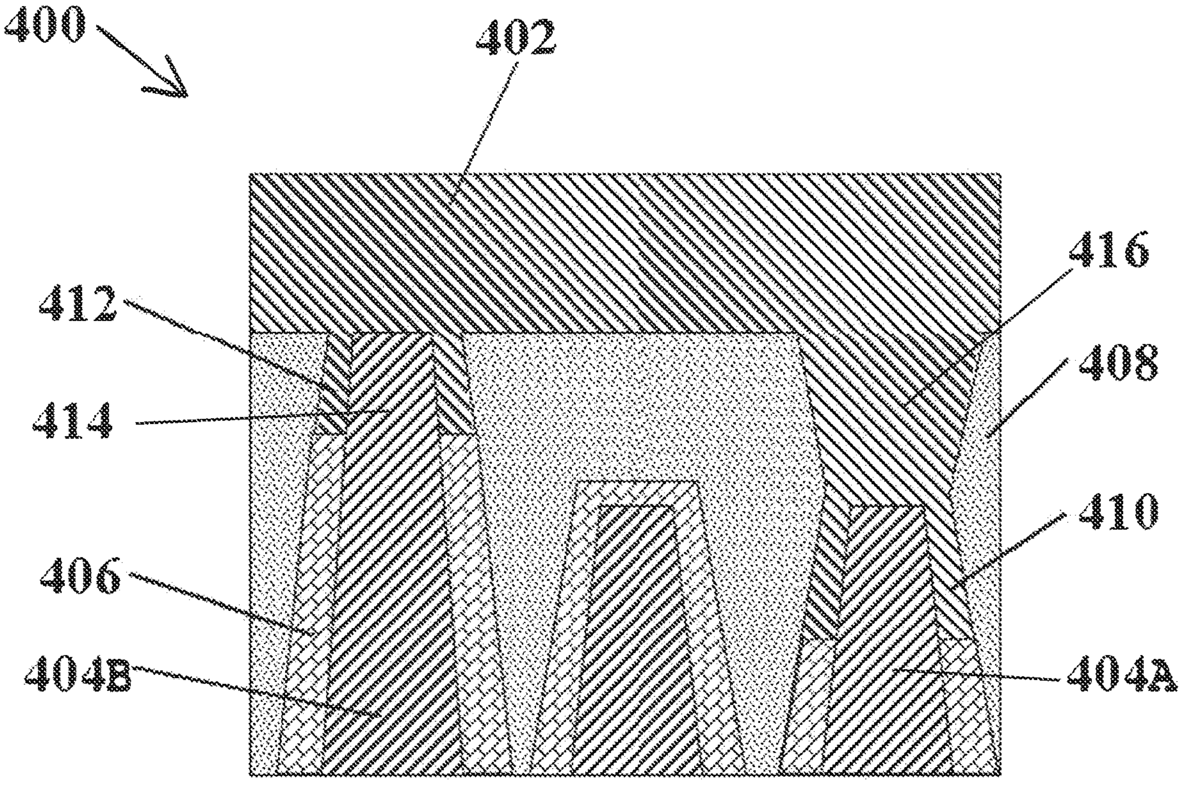
FIG. 4 is a cross-sectional representation of a wrap-around interconnect structure according to an illustrative embodiment.

Referring to FIG. 4, an interconnect structure 400 can include both the interconnect structure 200 as shown in FIG. 2 and the interconnect structure 300 as shown in FIG. 3. More specifically, a first wiring line 404A may connect to a second wiring line 402 via a damascene via 416 and a wrap-around portion 410 formed along each side of the first wiring line 404A, as described above in FIG. 2. Further, a first wiring line 404B may connect to the second wiring line 402 via a subtractive via 414 and a wrap-around portion 412 formed along each side of the subtractive via 414, as described above in FIG. 3. Like the above embodiments, a dielectric layer 308 may separate the second wiring line 402 from the first wiring lines 404A, 404B. When there are two different interconnect structures, such as interconnect structure 200 of FIG. 2 and interconnect structure 300 of FIG. 3, the material of the damascene via and the subtractive via may be the same or different. Further, the sizes of the damascene via and the subtractive via may be the same or different.

Figure 5:
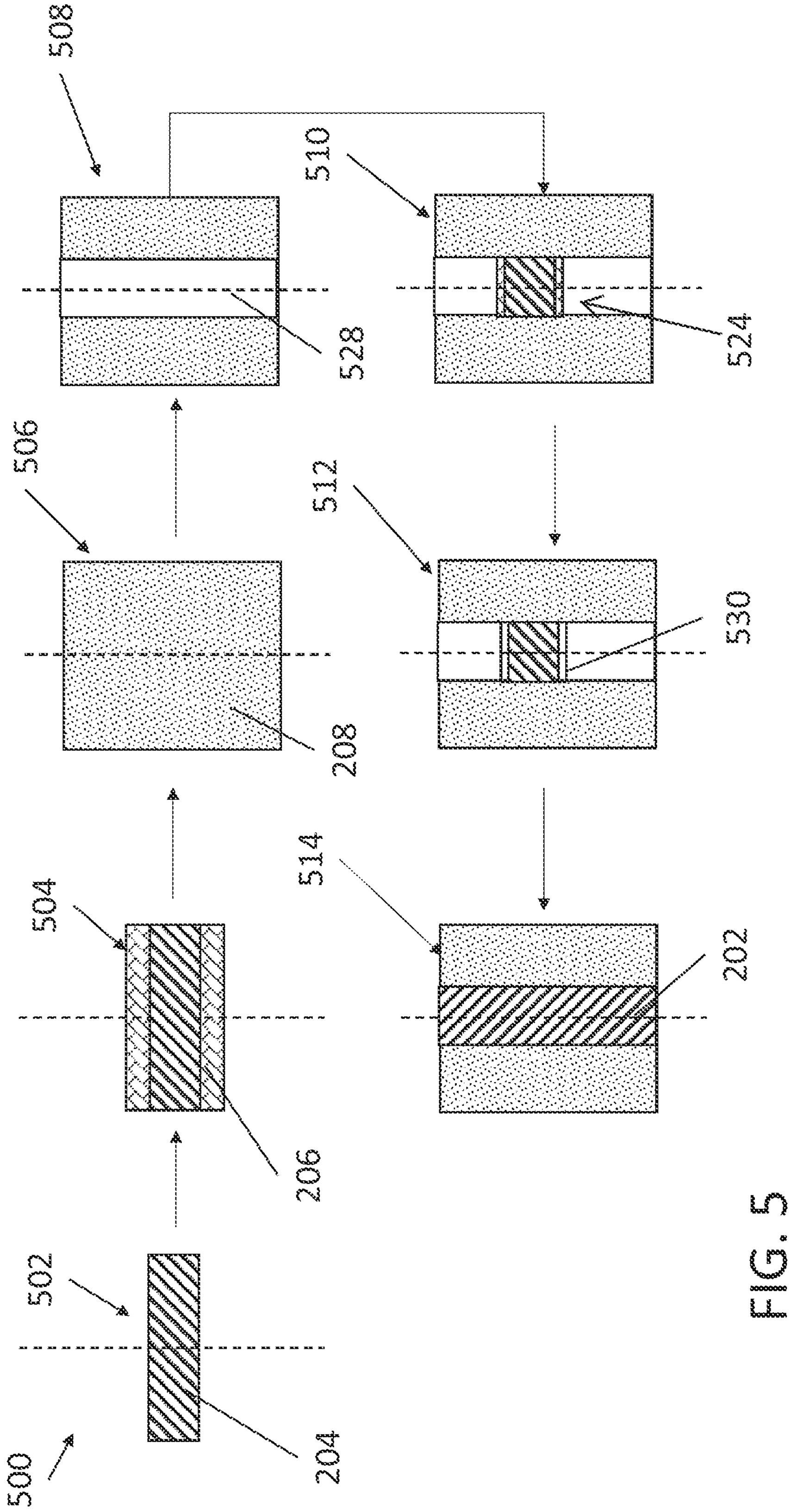
FIG. 5 is a top view illustrative of a process for making the wrap-around interconnect structure of FIG. 2.
Figure 6:
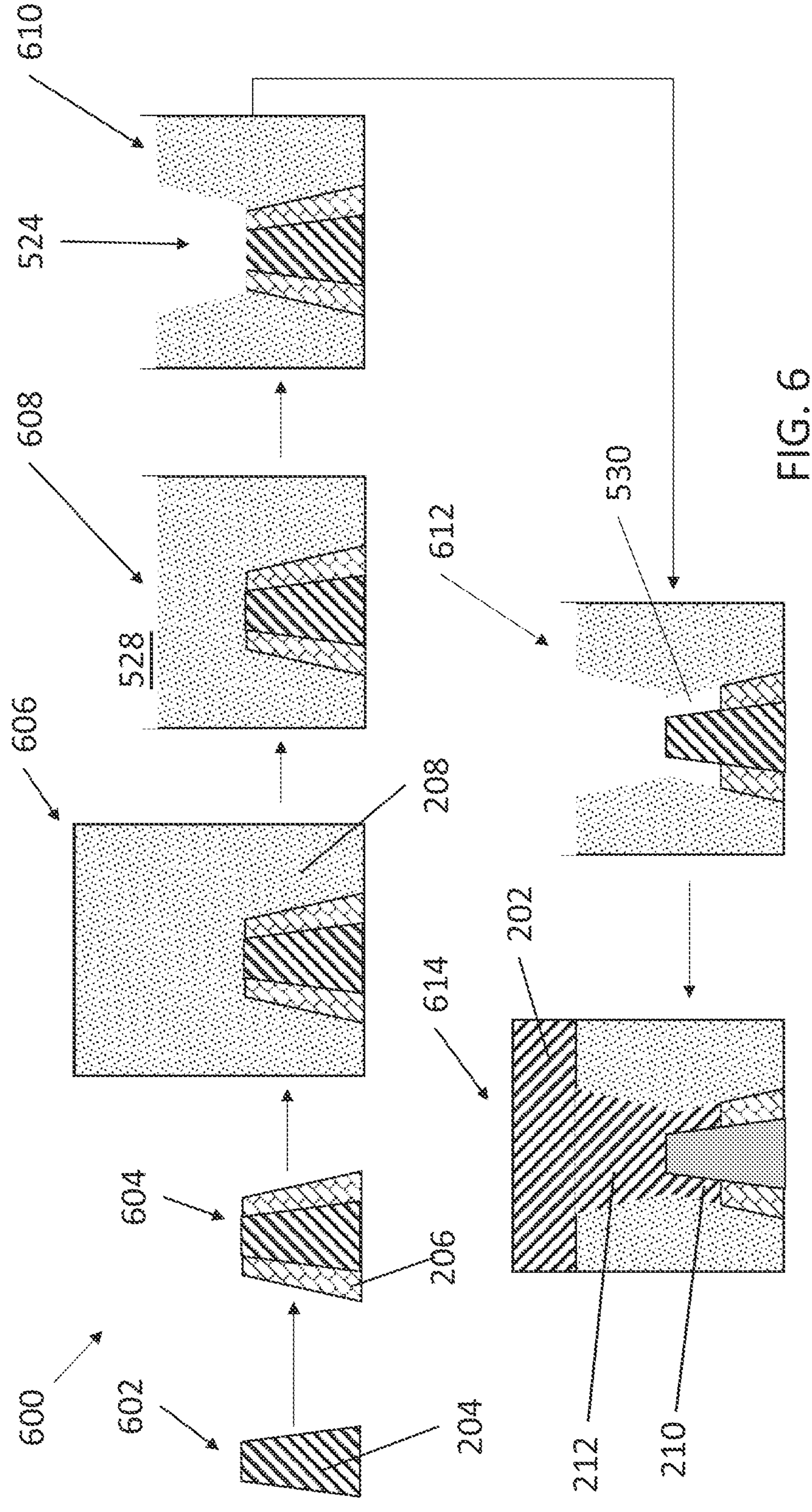
FIG. 6 is a cross-sectional side view illustrative of a process for making the wrap-around interconnect structure of FIG. 2.

Referring now to FIGS. 5 and 6, a top view 500 and a cross-sectional view 600 are shown to illustrate a process for making the interconnect structure 200 shown in FIG. 2. A first graphic 502, 602 illustrates the formation of the first wiring line 204 as a subtractive line. A second graphic 504, 604 illustrates the adhesive layer 206 being applied to the sides of the first wiring line 204. A third graphic 506, 606 illustrates the dielectric layer 208 applied around the first wiring line 204 and the adhesive layer 206. A fourth graphic 508, 608 illustrates how a space 528 for the second wiring line 202, as applied in a later step, can be etched from the dielectric layer 208. A fifth graphic 510, 610 illustrates a first etch 524 of the dielectric layer 208 to reach the top of the first wiring line 204 and the top of the adhesive layer 206. A sixth graphic 512, 612 illustrates a second etch 530 of the adhesive layer 206. As discussed above, the second etch 530 can extend down at least a portion of the height of the first wiring line 204. At a final graphic 514, 614, the second metal layer 202 is applied to fill the first etch 524 and the second etch 530 to form an interconnect structure that includes the damascene via 212 and the wrap-around portion 210.

Figure 7B:
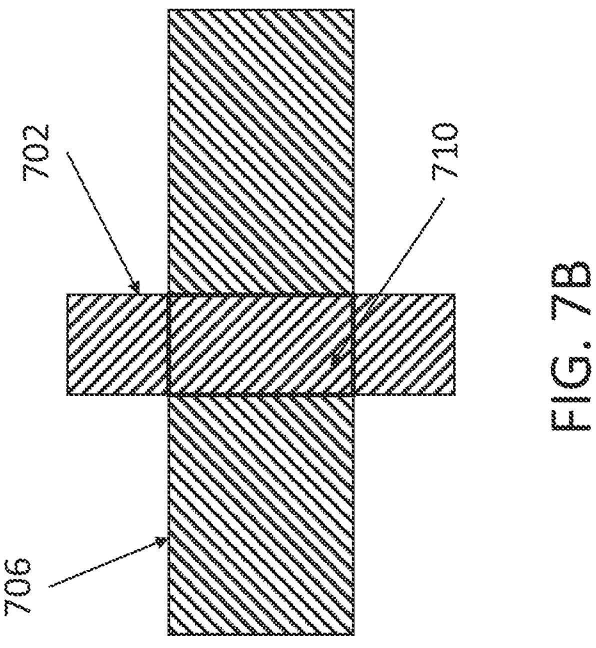
FIG. 7B is a representation of a 2×1 via landing on a 2× wide line according to a conventional process.
Figure 7A:
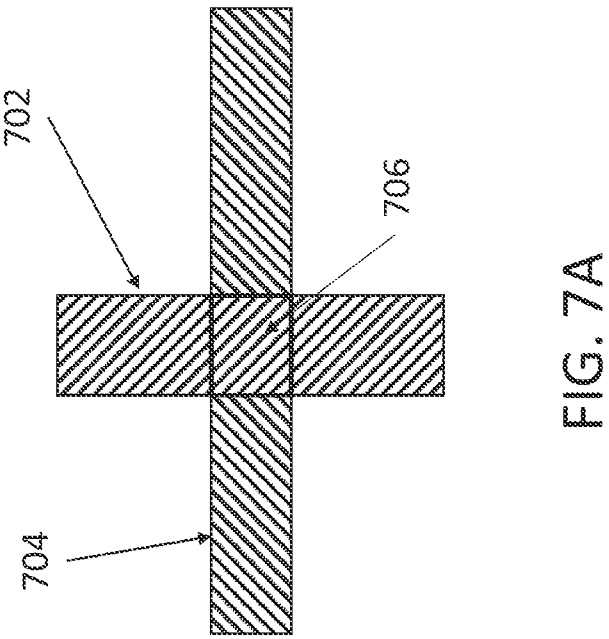
FIG. 7A is a representation of 1×1 via landing on a 1× wide line according to a conventional process.
Figure 7C:
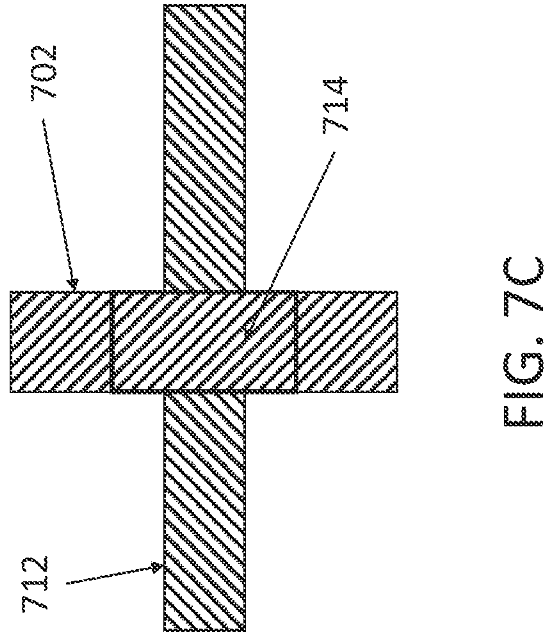
FIG. 7C is a representation of a 2×1 via landing on a 1× wide line according to an illustrative embodiment.

Referring to FIGS. 7A through 7C, as discussed above, aspects of the present disclosure permit improved and increased contact area between two wiring lines. In FIG. 7A, a lower wiring line 704 that has a one-times (1×) width can contact an upper wiring line 702 having a 1× width at a 1×1 via landing 706. In FIG. 7B, the lower wiring line has a two-times (2×) width that can contact the upper wiring line 702 having a 1× width at a 2×1 via landing 710. Through the use of the interconnect structures of the present disclosure, a 1× lower wiring line 712 can contact the 1× upper wiring line 702 at a 2×1 via landing 714, where such interconnect structure improves the contact between the wiring lines 712, 702.

Example Process

Figure 8:
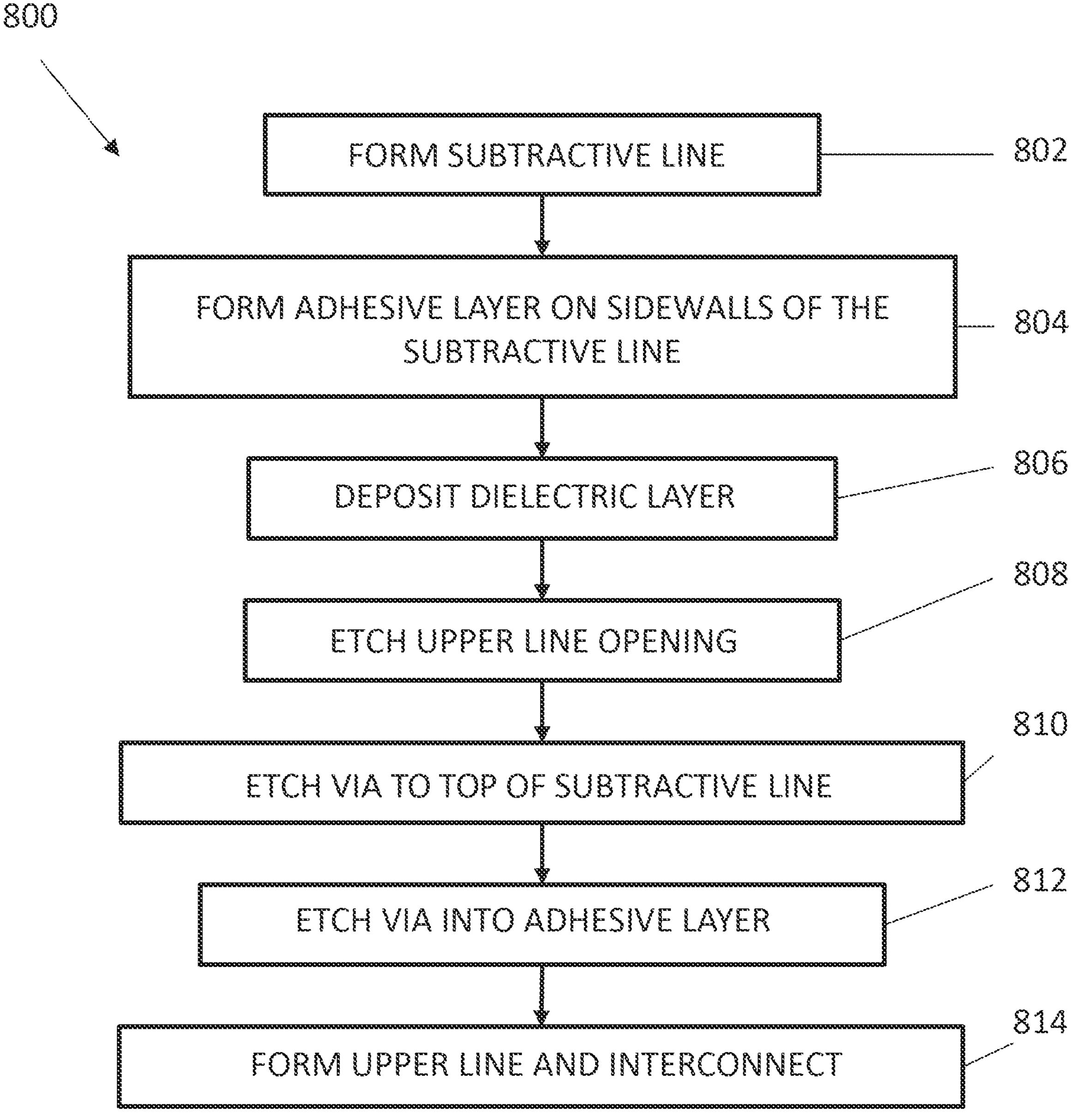
FIG. 8 presents an illustrative process related to the methods for forming an interconnect structure, consistent with an illustrative embodiment.

It may be helpful now to consider a high-level discussion of an example process. To that end, FIG. 8 presents an illustrative process 800 related to the methods for forming an interconnect structure. Process 800 is illustrated as a collection of blocks, in a logical flowchart, which represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform functions or implement abstract data types. In each process, the order in which the operations are described is not intended to be construed as a limitation, and any number of the described blocks can be combined in any order and/or performed in parallel to implement the process.

Referring to FIG. 8, the process 800 can include a block 802 of forming a subtractive line, such as the first wiring layer 204, described above. A block 804 can then form an adhesive layer, such as adhesive layer 206, described above, on the sidewalls of the subtractive line. The adhesive layer may be a dielectric material that is different from the dielectric layer deposited in block 806. This difference allows the selective etching (as described in block 812, below) of the adhesive layer to permit formation of the wrap-around interconnect. In some embodiments, the adhesive may be silicon carbide, silicon nitride, silicon carbon nitride, or the like.

The process 800 can further include a block of etching the upper line opening. Such as opening can be later used for forming the upper wiring line, such as second wiring line 202, discussed above. Block 808 describes a further etching to form an opening to the top of the subtractive line and the top of the adhesive layer. Block 810 describes a further etching to etch into the adhesive layer, removing such layer down a certain portion of the height of the subtractive line. Finally, at block 814, the upper line and interconnect can be formed, where the interconnect not only contacts the top of the subtractive line, but also extends downward along the sides of the subtractive line.

CONCLUSION

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to a flowchart illustration and/or block diagram of a method, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of an appropriately configured computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The call-flow, flowchart, and block diagrams in the figures herein illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. An interconnect structure for connecting an upper wiring line to a lower wiring line, comprising:

a via connecting a lower portion of the upper wiring line with an upper surface of the lower wiring line;

an adhesive layer located along a portion of the lower wiring line;

a dielectric layer located around the lower wiring line, wherein the adhesive layer is located between the dielectric layer and the lower wiring line; and a wrap-around via portion formed integrally with the via, the wrap-around via portion extending along and electrically contacting a portion of a vertical side surface of the lower wiring line, wherein the wrap-around via portion is in direct contact with the adhesive layer, the dielectric layer, and the lower wiring line.

2. The interconnect structure of claim 1, wherein the via has a width extending beyond a top surface of the lower wiring line.

3. The interconnect structure of claim 1, wherein the wrap-around portion replaces removed portions of an adhesive layer on the lower wiring line.

4. The interconnect structure of claim 1, wherein the via is a damascene via.

5. The interconnect structure of claim 1, wherein the via is a subtractive via.

6. The interconnect structure of claim 1, wherein:

the lower wiring line includes a first lower wiring line and a second lower wiring line;

the via includes a first via and a second via, the first via is a damascene via connecting the lower portion of the upper wiring line with an upper surface of the first lower wiring line, the second via is a subtractive via connecting the lower portion of the upper wiring line with an upper surface of the second lower wiring line; and the wrap-around portion includes a first wrap-around portion and a second wrap-around portion, the first wrap-around portion formed integrally with the first via, the first wrap-around portion extending along and electrically contacting a portion of the sides of the first lower wiring line, the second wrap-around portion formed integrally with the second via, the second wrap-around portion extending along and electrically contacting a portion of the sides of the second lower wiring line.

7. The interconnect structure of claim 6, wherein a material of the damascene via is different from a material of the subtractive via.

8. The interconnect structure of claim 6, wherein a material of the damascene via is the same as a material of the subtractive via.

9. The interconnect structure of claim 1, wherein the portion of the sides of the lower wiring line that the wrap-around portion extends along and electrically contacts the sides of the lower wiring line is at least 10 percent of a height of the lower wiring line.

10. The interconnect structure of claim 1, wherein a portion that the wrap-around via portion extends along and electrically contacts the sides of the lower wiring line is at least 20 percent of a height of the lower wiring line.

11. An interconnect structure for connecting an upper wiring line to a lower wiring line, comprising:

a damascene via connecting a lower portion of the upper wiring line with an upper surface of the lower wiring line and an upper surface of an adhesive layer on sides of the lower wiring line, wherein the adhesive layer is in direct contact with the lower wiring line;

a dielectric layer located around the lower wiring line, wherein the adhesive layer is located between the dielectric layer and the lower wiring line; and a wrap-around via portion formed integrally with the damascene via, the wrap-around portion extending along and electrically contacting a portion of a vertical side surface of the lower wiring line, wherein the wrap-around via portion is in direct contact with the adhesive layer, the dielectric layer, and the lower wiring line.

12. The interconnect structure of claim 11, further comprising:

a second lower wiring line;

a subtractive via interconnecting the lower portion of the upper wiring line with a second upper surface of the second lower wiring line; and a second wrap-around portion extending along and electrically contacting a second portion of the sides of the second lower wiring line.

13. The interconnect structure of claim 11, wherein the portion of the sides of the lower wiring line that the wrap-around portion extends along and electrically contacts the sides of the lower wiring line is at least 10 percent of a height of the lower wiring line.

14. The interconnect structure of claim 11, wherein a portion of the wrap-around via portion extends along and electrically contacts the sides of the lower wiring line is at least 20 percent of a height of the lower wiring line.

* * * * *